INVENTOR.
HARRY WEISBERG
BY
W. S. Hill
AGENT

METHOD OF ETCHING TO DICE A SEMICONDUCTOR SLICE

Filed July 18, 1963 2 Sheets-Sheet 2

INVENTOR.
HARRY WEISBERG
BY
W. B. Hill
AGENT

United States Patent Office 3,288,662
Patented Nov. 29, 1966

3,288,662
METHOD OF ETCHING TO DICE A SEMICONDUCTOR SLICE
Harry Weisberg, Forty Fort, Pa., assignor to Radio Corporation of America, a corporation of Delaware
Filed July 18, 1963, Ser. No. 295,880
3 Claims. (Cl. 156—11)

Figure 1:
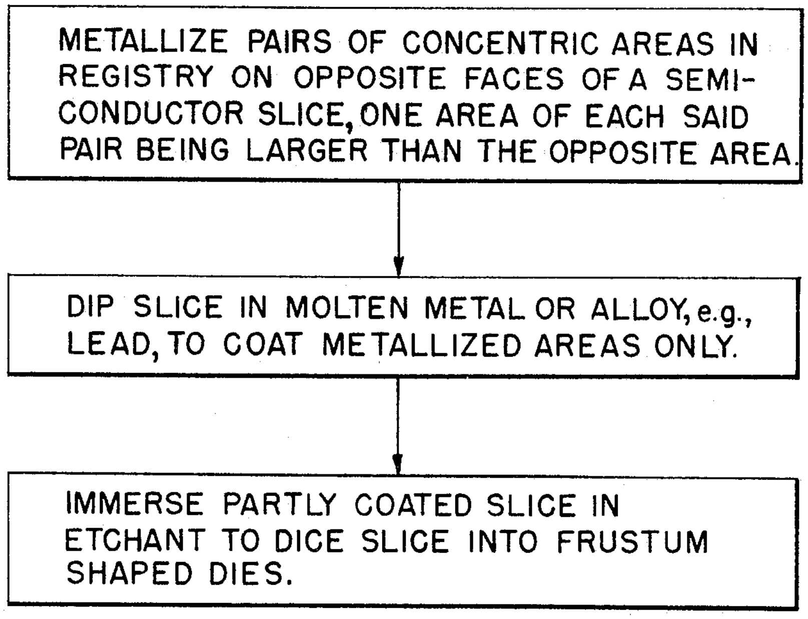

This invention relates to improved methods of fabricating semiconductor devices, and to improved devices made by the method.

In the fabrication of semiconductor devices such as diodes, transistors, and the like, it is often desired to dice a relatively thin but large area slice or wafer of semiconductive material into a plurality of relatively small dice or pellets. The wafer may, for example, be a transverse slice of a monocrystalline semiconductor ingot prepared by the Czochralski crystal pulling technique. The slices are commonly a few mils thick, and have an irregular circular shape with an area of the order of a square inch. The wafers are diced into regular pellets, or dice, which may, for example, be squares about 40 to 100 mils on edge and about 4 to 12 mils thick.

For certain device applications, a regular perpendicular-sided die or pellet is not desirable. For example, in the fabrication of silicon rectifiers, it is found that when the die used has the general shape of a cone segment or frustum, the completed devices show improved electrical characteristics when compared to similar devices fabricated from regular perpendicular-sided dice. It is believed the improved characteristics of devices made from frustum-shaped dice are due to the better stabilization of surface characteristics and the increased ability to withstand power surges in the reverse direction obtained in frustum-shaped dice.

Several methods are known for rapidly dicing slices of crystalline semiconductive material into a plurality of regular perpendicular-sided dice. The slice may be waxed down on a glass slide, then cut at right angles by gang saws. Alternatively, since the slice is brittle, it may be scored with a hard pointed tool such as a diamond point, then broken up into a plurality of dice. Magneto-strictive cutting tools or jets of an abrasive material may also be utilized for dicing semiconductive slices or wafers. However, when it is desired to form frustum-shaped dice, relatively slow cutting tools have been used and each frustum formed individually.

It is an object of this invention to provide an improved method of making semiconductor devices wherein a large slice or wafer of semiconductive material is sub-divided into a number of smaller units.

Another object of this invention is to provide an improved method of rapidly and inexpensively dicing a semiconductive slice into a plurality of dice.

Still another object is to provide an improved method of dicing a semiconductive slice into frustum-shaped dice.

These and other objects may be accomplished according to the invention which comprises a novel and improved method of dicing a semiconductive slice into frustum-shaped dice. This method comprises the steps of masking at least one pair of opposed areas on opposite major faces of a wafer of semiconductive material with an etch resist, one of the masked areas of each pair being larger than the other masked area of the pair, and then immersing the wafer in an etchant to dissolve the unmasked portions through the thickness of the wafer to leave at least one semiconductive die having sloping sides. This procedure reduces the scrap rate, avoids individual handling of the dice, and increases the production rate.

In one embodiment of the invention, the following method is employed. The slice is metallized on pairs of predetermined areas in registry on opposite major faces of the slice so that one area of each said pair is larger than the opposite area. The slice is next dipped in an etchant-resistant substance, which may for example consist of molten lead, molten tin, or a mixture of molten metals such as solder, which is resistant to the action of a semiconductor etchant to be used subsequently. The molten metal or solder does not "wet" the semiconductor slice, but adheres to the metallized areas of the slice and forms a relatively thick protective layer on the metallized portions only of the slice faces. The semiconductor slice is then immersed in a suitable etchant which dissolves those portions of the slice between the areas covered by the protective layer, thus forming a plurality of frustum-shaped pellets or dice coated with a relatively thick metal layer on its opposing major faces, and corresponding in size and shape to the metallized areas on the original slice. Electrical leads may conveniently be attached to the pellet by soldering them to one of the metal layers.

The invention will be described in greater detail in the following examples, considered in conjunction with the accompanying drawing, in which:

FIGURE 1 is a chart indicating the principal steps in the dicing of a semiconductvie slice in accordance with the methods of this invention; and, FIGURES 2–7 are cross-sectional views of a semiconductive slice during successive steps in one embodiment of the invention.

EXAMPLE I

As represented in FIGURE 1, pairs of preselected concentric areas i.e., with centers in registry on opposite major faces of a semiconductor wafer or slice are metallized by any convenient process. The wafer material may be any of the conventional solid crystalline semiconductors, such as elemental silicon, germanium-silicon alloys, germanium, or compound semiconductors such as silicon carbide, the phosphides, arsenides, and antimonides of aluminum, gallium and indium, and the sulfides, selenides, and tellurides of zinc, cadmium and mercury. In this example, the wafer or slice of crystalline semiconductive material consists of a monocrystalline silicon-germanium alloy, as described in U.S. 2,997,410, issued to B. Selikson on August 22, 1961, and assigned to the assignee of this application. The concentric areas of the slice are metallized with a thin film of a metal selected from the group of metals which are chemically and electrically inert with respect to the particular semiconductor utilized. The suitable metals for this purpose are the group consisting of cobalt, nickel, copper, rhodium, palladium, silver, iridium, platinum and gold. In this example, portions of the silicon-germanium slice are metallized with rhodium. The pairs of concentric metallized areas are circles 50 mils in diameter on one face of the slice, and 100 mils in diameter on the opposite face of the slice.

Metallization of the preselected areas on the slice faces may be accomplished by any convenient technique after masking the faces of the slice. In this example, the faces of the slice or wafer are suitably masked by means of a masking jig to expose pairs of predetermined concentric circular areas in registry on opposite faces. The masked slice or wafer is placed in an evacuated chamber. A rhodium pellet within the chamber is heated by means of a tungsten wire so that the rhodium evaporates and forms a thin film over the unmasked portions only of the semiconductor slice.

The semiconductor slice is next dipped in a molten metal. The metal is selected from the group which is chemically and electrically inert with respect to the particular semiconductor. The melting point of the molten metal or alloy utilized is lower than that of the semiconductor. Lead and tin and lead-tin alloys are suitable materials for this purpose. In this example, the molten metal consists of lead. The exposed portions of the silicon-germanium slice are not affected, since the molten metal does not "wet" silicon or high silicon alloys. However, the preselected areas of the slice which were metallized by the rhodium film are "wet" by the molten lead, and hence are covered by a relatively thick lead coating, as described in U.S. 3,046,176, issued July 24, 1962, to W. A. Bosenberg, and assigned to the assignee of this application.

The wafer is then immersed in a suitable etchant which is capable of dissolving the wafer material, but is relatively inert with respect to lead. In this example, the etchant is composed of equal portions of concentrated nitric acid and concentrated hydrofluoric acid. The acid dissolves those portions of the germanium-silicon wafer which are not covered by a lead coating, but is relatively inert with respect to lead. In practice, a plurality of the coated semiconductor slices are dropped in a beaker or container of the etchant, and are left in the beaker for about five minutes. If desired, the etchant may be agitated by ultrasonic energy during this step. During this period, the portions of each slice not protected by a lead coating are dissolved, and the slice separates into a plurality of lead-coated frustum-shaped dice. In this example, the major die faces are circles, one face of each die being 50 mils in diameter, and the other face of each die being about 100 mils in diameter. The sizes and shapes of the die major faces always correspond to the sizes and shapes of the preselected metallized areas on the slice faces. The dice may then be recovered by decanting the liquid and washing thoroughly.

The lead-coated faces of each pellet may be utilized as a solderable surface for attaching electrical connecting wires. Alternatively, the die may be mounted on a base plate by means of the lead coating on one face of the die.

EXAMPLE II

In another embodiment of the invention, which is described in this Example II, the entire surface of the semiconductor slice or wafer is metallized. Portions of the metal film are then removed, so as to leave a pattern of concentric pairs of metallized areas in registry on the opposite major slice faces, one metallized area of each said pair being larger than the opposite area. The remaining steps of dipping the slice in a molten metal or alloy so as to coat only the metallized area of the slice, and then treating the slice in an etchant to dissolve the uncoated portions of the slice, are similar to those described above in connection with Example I.

Figures 2, 3, 4, 5, 6, 7:
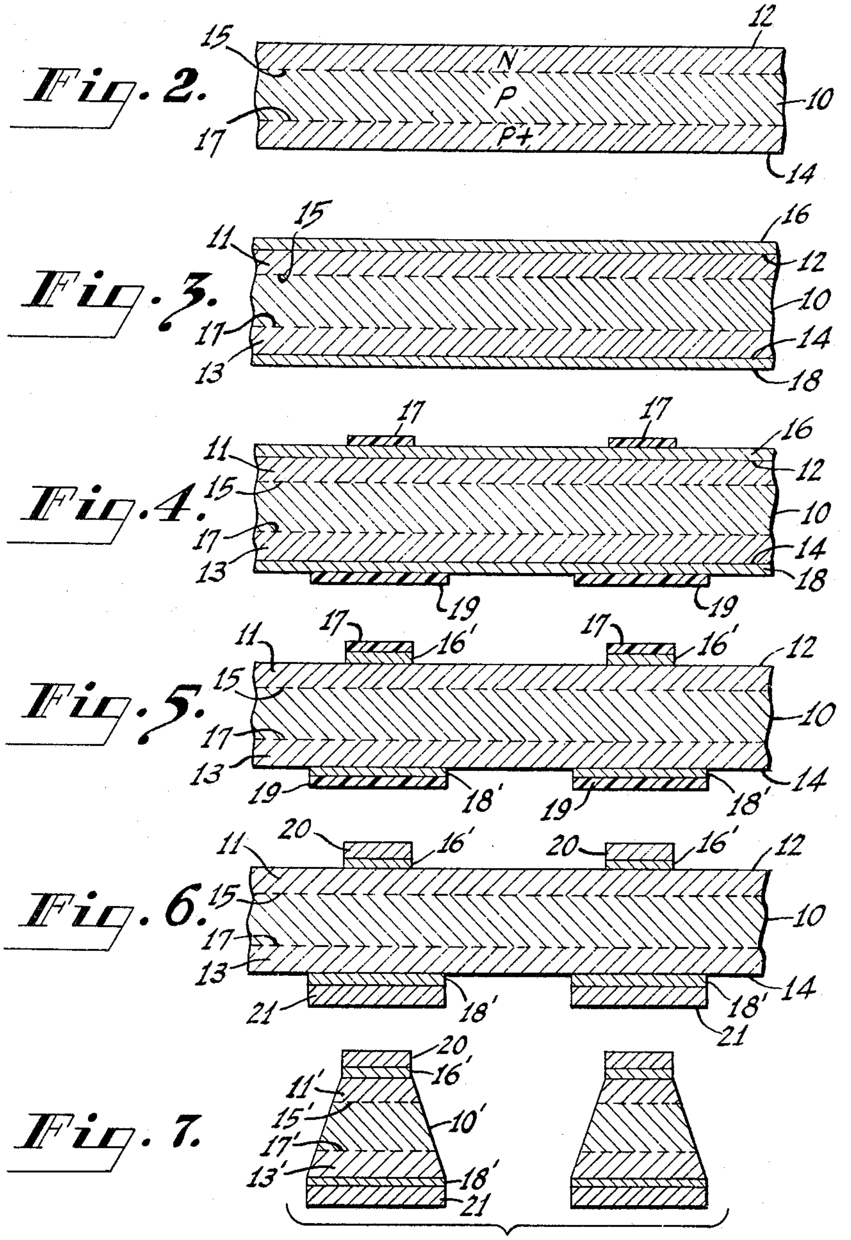

Referring now to FIGURE 2, a slice or wafer 10 of semiconductive material is prepared with two opposing major faces 12 and 14. The slice 10 may consist of any of the conventional solid crystalline semiconductors mentioned above. In this example, slice 10 consists of monocrystalline silicon. One or more p-n junctions may be introduced into slice 10 by standard diffusion techniques pior to the sub-division of the slice into dice. In this example, slice 10 is of P-type conductivity, and has an N-type region 11 adjacent face 12, a p-n junction 15 between region 11 and the bulk of slice 10, a P+ region 13 adjacent face 14, and a P—P+ junction 17 between the P+ region 13 and the P-type bulk of slice 10.

Thin films of metal 16 and 18 (FIGURE 3) are then deposited by any convenient method over faces 12 and 14 respectively of the silicon slice. In this example, the metal is nickel, and deposition is accomplished by an electroless nickel plating technique as follows. The wafer is treated in a solution consisting of 30 grams per liter nickel chloride, 10 grams per liter sodium hyposulfite, 65 grams per liter ammonium citrate, 50 grams per liter ammonium chloride, and sufficient ammonium hydroxide to make the solution blue in color. The plating stops when the silicon surface is completely covered with nickel. If desired, the adherence of the nickel to the silicon may be improved by sintering the nickel for about thirty minutes at about 800° C. in an atmosphere of hydrogen or forming gas. After the sintering, a second film of electroless nickel is deposited over the surface.

Next, the silicon slice is placed in a masking jig so as to expose a predetermined pattern in registry on the opposite faces of the slice. In this example, the exposed areas of the pattern consist of an array of circles 50 mils in diameter on slice face 12, and 100 mils in diameter on slice face 14. The circles on one slice face are concentric with those on the opposite face. A suitable acid resist is sprayed over the wafer, so as to cover the unmasked circular areas only, the spaces between the circles being protected by the masking jig. In this example, the acid resist consists of apiezon wax dissolved in toluene. Two pairs of concentric resist-coated areas on opposing sides of slice 10 are illustrated in FIGURE 4, each pair consisting of a smaller area 17 and a larger area 19.

The wafer is then removed from the jig and treated for about six to eight seconds in an etchant consisting of 4 volumes hydrofluoric acid and 1 volume nitric acid. The exact composition of this etchant is not critical, and a solution of 9 parts nitric acid to 1 part hydrofluoric acid is also satisfactory. This brief treatment is sufficient to completely remove those portions of the nickel film (the spaces between the circles) which are not protected by the resist. Thus slice 10 is left as illustrated in FIGURE 5, with areas on face 12 consisting of the resist 17 over the remaining portions 16' of metal film 16, and areas on face 14 consisting of the resist 17 over remaining portions 18' of film 18.

The wax resist is then removed by treating the wafer with an organic solvent. In this example, the solvent is carbon tetrachloride, but other solvents such as toluene or trichloroethylene may be utilized if desired. After the resist is removed, the silicon wafer is left with a pattern of nickel-covered circles 16' and 18' in registry on opposite major faces, and is ready for dipping in a molten metal or alloy.

In this example, the silicon slice is dipped in a molten solder containing 40 weight percent lead and 60 weight percent tin. The exact composition of the solder is not critical. The molten solder does not "wet" the exposed silicon, and hence does not adhere to it, but does "wet" the nickel-covered circular portions of the slice faces, and forms a solder coating 20 and 21 (FIGURE 6) on metallized areas 16' and 18' respectively on these areas. These solder coatings 20 and 21 are relatively thick compared to the thickness of the nickel film.

The silicon slice is now diced by immersion for about five minutes in a beaker of etchant. In this example, the etchant consists of 4 volumes nitric acid to 1 volume hydrofluoric acid, but the exact composition of the etchant is not critical, and may vary from 1 volume nitric acid to 10 volumes nitric acid per volume of hydrofluoric acid. During this step, the exposed portions of the silicon are dissolved, and the slice is separated into a plurality of dice 10' (FIGURE 7) whose opposite major surfaces are coated with solder, each die being a frustum with one die face about 100 mils in diameter and the other die face about 50 mils in diameter. The beaker is decanted through a screen and the dice are washed with distilled water. An electrical connection may be readily made to either the small or the large face or both of each die by soldering a wire to the lead coating thereupon.

When dice shaped like circular cone segments or circular frustums are desired, the metallized areas on opposite faces of the semiconductor slice are circular. However, other die shapes may be obtained by metallizing areas shaped like triangles or other figures.

While preferred forms of the invention have been illustrated, it will be understood that various modifications may be made by those skilled in the art without departing from the spirit and scope of the invention as defined in the specification and appended claims. For example, electroless cobalt films may be utilized in place of electroless nickel. Metallic films may be deposited on a crystalline semiconductor slice by any convenient method, such as electroless plating, evaporation, electroplating, and the like. Instead of apiezon wax, other acid resists such as paraffin wax may be utilized. Alternatively, the acid resist may consist of a photoresist such as bichromated albumen, bichromated gum arabic, and the like. Commercially available photoresists may also be utilized.

There have thus been described improved methods of dicing a slice or wafer of any crystalline semiconductive material into shaped dice.

What is claimed is:

1. The method of dicing a slice of semiconductive material into frustum-shaped dice, comprising the steps of metallizing a plurality of paired concentric areas in registry on opposite major faces of said slice with a film of a metal selected from the group consisting of cobalt, nickel, rhodium, palladium, iridium, platinum, copper, silver and gold, one area of each said pair being larger than the opposite area, coating said metallized areas only with a metallic material selected from the group consisting of lead, tin and lead-tin alloys, and immersing said slice in an etchant capable of dissolving said semiconductive material but relatively inert with respect to said metallic material to dissolve the uncoated portions of said slice and produce a plurality of frustum-shaped dice.

2. The method of dicing a slice of semiconductive material into frustum-shaped dice, comprising the steps of depositing a metallic film selected from the group consisting of cobalt, nickel, rhodium, palladium, iridium, platinum, copper, silver and gold on said slice, removably masking opposite major faces of said slice to expose pairs of predetermined areas on opposite faces of said slice, one area of each said pair being larger than the opposite area, coating said exposed areas on said slice with an acid resist, treating said slice in an acid bath so as to remove the portions of said metal film not covered by said resist, removing said resist, dipping said slice in a melt of metallic material selected from the group consisting of lead, tin and lead-tin alloys so as to coat said predetermined areas with said metallic material, and immersing said slice in an etchant capable of dissolving said semiconductive material but relatively inert with respect to said metallic coating so as to dissolve the unmasked portions of said slice and produce a plurality of frustum-shaped dice.

3. The method of dicing a slice of silicon into frustum-shaped dice, comprising the steps of depositing a nickel film on said slice, masking opposite major faces of said slice to expose concentric pairs of predetermined areas in registry on opposite faces of said slice, one area of each said pair being larger than the opposite area, coating said exposed areas on said slice with an acid resist, treating said slice in an acid bath so as to remove the portions of said nickel film not covered by said resist, removing said resist, dipping said slice in molten lead so as to coat said predetermined areas with lead, and immersing said slice in an etchant capable of dissolving silicon but relatively inert with respect to lead to dissolve the uncoated portions of said slice and produce a plurality of lead-coated frustum-shaped dice.

References Cited by the Examiner

UNITED STATES PATENTS

| | | | |
|---|---|---|---|
| 2,944,321 | 7/1960 | Westberg. | |
| 3,046,176 | 7/1962 | Bosenberg | 156—11 |
| 3,154,450 | 10/1964 | Hoeckelman et al. | 156—11 X |

JACOB H. STEINBERG, *Primary Examiner.*